United States Patent
Ahn et al.

[11] Patent Number: 6,093,622
[45] Date of Patent: Jul. 25, 2000

[54] ISOLATION METHOD OF SEMICONDUCTOR DEVICE USING SECOND PAD OXIDE LAYER FORMED THROUGH CHEMICAL VAPOR DEPOSITION (CVD)

[75] Inventors: Dong-ho Ahn; Sung-eui Kim, both of Suwon; Yu-gyun Shin, Seoul, all of Rep. of Korea

[73] Assignee: Samsung Electronics, Co., Ltd., Suwon, Rep. of Korea

[21] Appl. No.: 09/148,060

[22] Filed: Sep. 4, 1998

[30] Foreign Application Priority Data

Sep. 8, 1997 [KR] Rep. of Korea ............... 97-46188
Dec. 30, 1997 [KR] Rep. of Korea ............... 97-77778

[51] Int. Cl.⁷ .................................................. H01L 21/76
[52] U.S. Cl. ........................... 438/439; 438/426; 438/431; 438/435; 438/444; 438/445; 438/446
[58] Field of Search ................................. 438/426, 425, 438/431, 435, 445, 444, 446, 439

[56] References Cited

U.S. PATENT DOCUMENTS

| | | |
|---|---|---|
| Re. 35,294 | 7/1996 | Vasquez . |
| 5,326,715 | 7/1994 | Jang et al. . |
| 5,393,692 | 2/1995 | Wu . |
| 5,395,790 | 3/1995 | Lur . |
| 5,457,067 | 10/1995 | Han . |
| 5,504,034 | 4/1996 | Rapisarda . |
| 5,658,822 | 8/1997 | Wu et al. ............... 438/446 |
| 5,824,594 | 10/1998 | Kim et al. ............... 438/446 |
| 5,834,360 | 11/1998 | Tesauro et al. ............... 438/445 |
| 5,849,626 | 12/1998 | Song ............... 438/444 |
| 5,863,827 | 1/1999 | Joyner ............... 438/425 |
| 5,895,253 | 4/1999 | Akram ............... 438/424 |
| 5,910,018 | 6/1999 | Jang ............... 438/425 |
| 5,913,133 | 6/1999 | Lee ............... 438/444 |

OTHER PUBLICATIONS

D.H. Ahn et al., "A Highly Practical Modified Locos Isolation Technology For The 256 Mbit DRAM", 1994, 28.3.1–28.3.4.

Scott S. Roth et al., "Characterization of Polysiliconencaplsulated Local Oxidation", IEEE Transactions on Electron Devices vol. 39, No. 5 May 1992, pp. 1085–1089.

*Primary Examiner*—Long Pham
*Attorney, Agent, or Firm*—Marger Johnson & McCollom, P.C.

[57] ABSTRACT

An isolation method in the fabrication process of a semiconductor device is provided. The method forms an oxide layer as a buffer layer for reducing stress through chemical vapor deposition (CVD). By the method, a first pad oxide layer and a silicon nitride layer are formed on a semiconductor substrate, and then an silicon nitride layer pattern is formed by patterning, and undercuts are formed in the first pad oxide layer pattern. Subsequently, a second pad oxide layer is formed on the entire surface of the semiconductor substrate through CVD, and then spacers are formed on the sidewalls of both the patterned first pad oxide layer and silicon nitride layer and a field oxide layer is formed through thermal oxidation. Alternatively, a silicon layer is deposited without the spacers to form the field oxide layer. The second pad oxide layer is a buffer layer for buffering stress during formation of the field oxide layer.

21 Claims, 7 Drawing Sheets

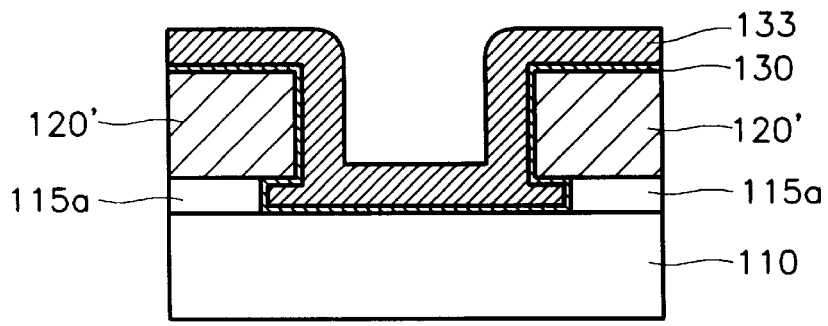
FIG. 1E
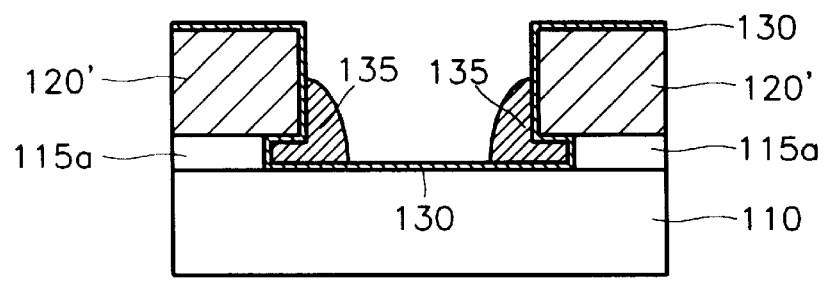
FIG. 1F
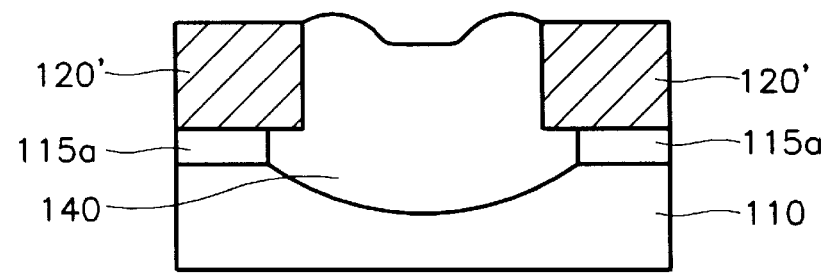
FIG. 1G
FIG. 1H
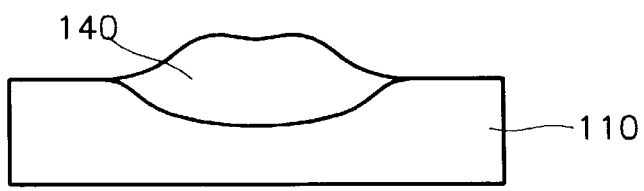

ISOLATION METHOD OF SEMICONDUCTOR DEVICE USING SECOND PAD OXIDE LAYER FORMED THROUGH CHEMICAL VAPOR DEPOSITION (CVD)

BACKGROUND OF THE INVENTION

1. Field of the Invention

The present invention relates to a method of fabricating a semiconductor integrated circuit, and more particularly, to an isolation method in the fabrication of a semiconductor device.

2. Description of the Related Art

To meet the demands of fabricating highly integrated semiconductor devices, much research is currently being conducted into isolation methods. The isolation of active regions of the semiconductor device is performed using either a trench isolation method, by which a trench is formed in an inactive region between the active regions and an insulating material is filled into the trench, or a local oxidation of silicon (LOCOS) method by which a field oxide layer is formed on the inactive region, typically a poly-Si buffered LOCOS (PBL) method using the LOCOS principle.

Meanwhile, the LOCOS isolation method is improved to be suitable for fabricating a highly-integrated semiconductor device having a design rule below 0.35 μm. The typical methods are poly encapsulated local oxidation (PELOX) disclosed in IEEE Trans. in ED, Vol. 39 No. 5 (1992) by Scott S. Roth et al., and poly-Si spacer (PSL) LOCOS disclosed in IEDM Tech Dig., p. 679 (1994) by D. H. Ahn et al.

SUMMARY OF THE INVENTION

An objective of the present invention is to provide an isolation method in the fabrication of a semiconductor device in which stress occurring at a boundary surface between an active region and an inactive region is reduced by an oxide layer formed through chemical vapor deposition (CVD) as a buffer layer, to thereby improve junction leakage current of a transistor and breakdown characteristics of a gate oxide layer.

Accordingly, to achieve the above objective, an isolation method in the fabrication of a semiconductor device according to the present invention is as follows.

A first pad oxide layer and a silicon nitride layer are sequentially formed on the semiconductor substrate. Then the silicon nitride layer is formed into a pattern that exposes the first pad oxide layer at an inactive region on the semiconductor substrate. The exposed first pad oxide layer is etched to form a first pad oxide layer pattern. Undercuts are preferably formed in the etched first pad oxide layer or the semiconductor substrate. A second pad oxide layer is formed on the entire surface of the resultant structure through chemical vapor deposition (CVD).

From this point on, according to a first embodiment of the invention, spacers are formed on the sidewalls of both the second pad oxide layer and the silicon nitride layer pattern, and a field oxide layer is formed on the inactive region by oxidizing the resultant semiconductor substrate where the spacers are formed. All material layers except the field oxide layer are removed from the semiconductor substrate where the field oxide layer is formed.

According to a second embodiment of the invention, a silicon layer is deposited to a predetermined thickness on the resultant structure where the second pad oxide layer is formed, and the resultant semiconductor substrate where the silicon layer is formed is oxidized to form a field oxide layer on an inactive region.

The chemical vapor deposition results in a device with superior electrical properties.

BRIEF DESCRIPTION OF THE DRAWINGS

The above objective and advantages of the present invention will become more apparent by describing in detail the preferred embodiment thereof with reference to the attached drawings, in which:

FIGS. 1A through 1H are sectional views of a semiconductor substrate illustrating process steps of an isolation method of a semiconductor device according to a first embodiment of the present invention;

DETAILED DESCRIPTION OF THE PREFERRED EMBODIMENTS

The two preferred embodiments of the invention are now described.

Embodiment 1

The first embodiment is now described with reference to FIG. 1A through FIG. 1H.

Figure 1A:
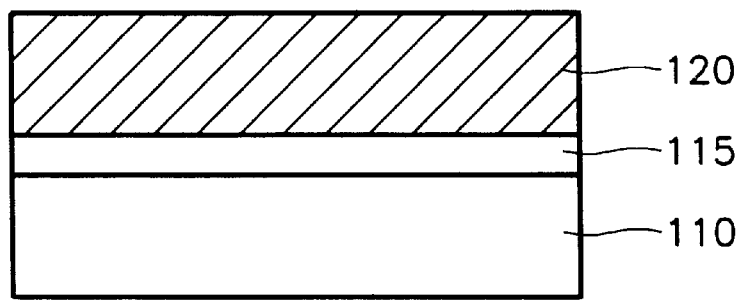

Referring to FIG. 1A, a first pad oxide layer 115 is formed on a semiconductor substrate 110, preferably out of $SiO_2$. Then an anti-oxidation layer 120 is formed on layer 115, out of SiN. Layer 120 is thus also known as a silicon nitride layer.

Figure 1B:
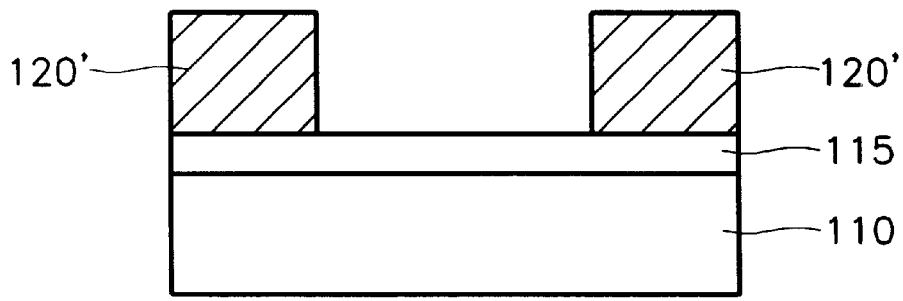

Referring to FIG. 1B, layer 120 is formed into an anti-oxidation layer pattern 120', that is also known as silicon nitride layer pattern 120', or just pattern 120'. Pattern 120' exposes a portion of layer 115 that corresponds to an inactive region of the substrate. Pattern 120' is formed using etch selectivity between the material of layer 120 (e.g. SiN), and that of layer 115 (e.g. $SiO_2$).

Figure 1C:
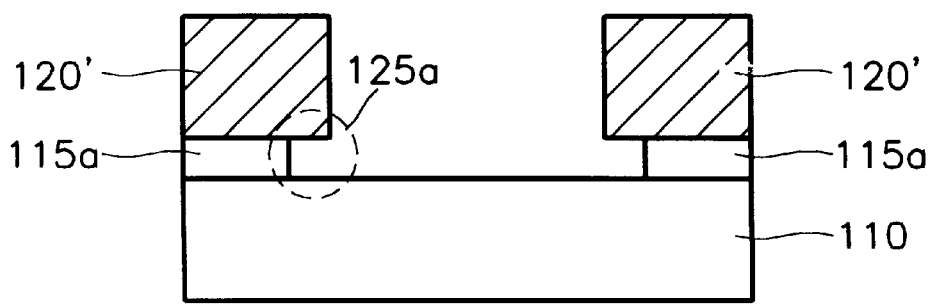
Figure 1C:
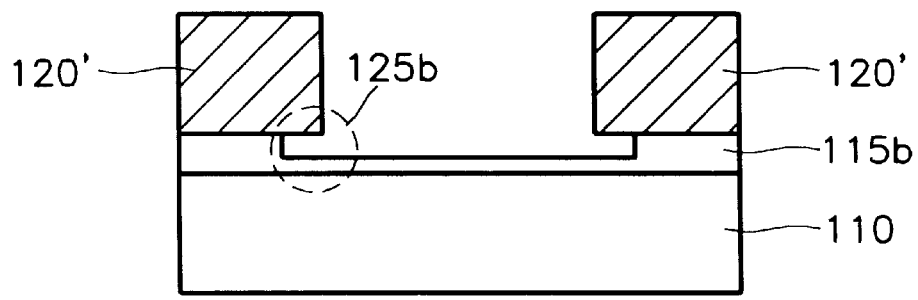
Figure 1C:
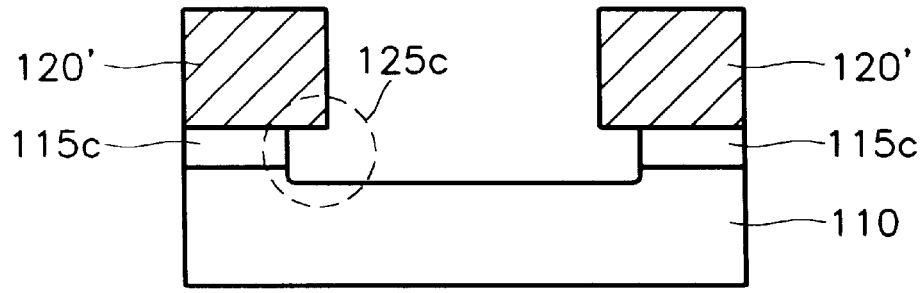

Referring to FIG. 1CA (and also to FIGS 1CB and 1CC), first pad oxide layer 115 is etched through pattern 120', thus forming a first pad oxide layer pattern 115a (115b, 115c respectively). Then the first pad oxide layer pattern is preferably etched isotropically to form undercuts 125a (125b, 125c respectively). Although preferred, the undercuts on the first pad oxide layer are not necessary. The effect of the present invention is realized even without them.

In the case of FIG. 1CA, etching reaches exactly the top surface of substrate 110.

In the case of FIG. 1CB, layer 115 is only partially etched to form a pattern 115b. This is accomplished by etching vertically by a predetermined thickness. Thus, the inactive region of substrate 110 is not exposed, and a portion of pattern 115b remains on the inactive region.

In the case of FIG. 1CC, layer 115 is etched completely until the substrate is exposed, and then etched further to form a recess into the substrate. Alternately, the undercuts can be formed first by etching isotropically layer 115, and then etching further to form a recess into the substrate.

The subsequent steps of the process are described only with reference to the case of FIG. 1CA, but that is to avoid duplication. The steps are the same for all three cases, except where indicated.

Figure 1D:
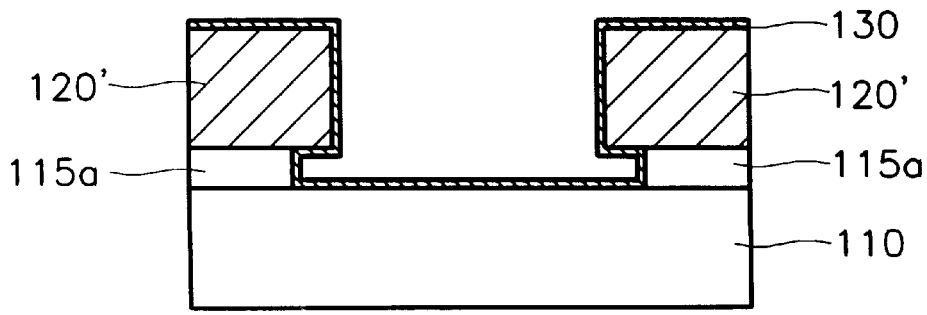

Referring to FIG. 1D, a second pad oxide layer 130 is formed on the entire surface of the resultant structure. Layer 130 is formed also on the surfaces of the undercuts, if they have been included.

The thickness of second pad oxide layer 130 is preferably 30–300 Å. If the inactive region of the semiconductor substrate 110 is not exposed (as in FIG. 1CB), the combined thicknesses of remaining pattern 115b and layer 130 is within the range of 30–300 Å.

Layer 130 is a buffer layer for reducing stress applied to the semiconductor substrate, when a field oxide layer is formed through thermal oxidation. Layer 130 is a variable which changes the electrical characteristics of the semiconductor device.

A key part of the present invention is that buffer layer 130 is formed through a chemical vapor deposition (CVD) process, unlike in the prior art where it is formed through thermal oxidation. The CVD process results in a layer 130 that buffers more effectively the stress caused by formation of the field oxide layer, than a layer formed according to the prior art. This is confirmed by comparing the electrical characteristics of resulting semiconductor devices, as is done in FIGS. 3A and 3B later in this document.

Referring to FIG. 1E, a spacer formation layer 133 is formed on the second pad oxide layer 130. Preferably, layer 133 is formed of a material highly resistant to thermal oxidation, and even more preferably of such a material that contains silicon, e.g., silicon oxide, silicon nitride, polysilicon or amorphous silicon.

Referring to FIG. 1F, layer 133 is etched anisotropically, to form spacers 135 on both sidewalls of pattern 120' and pattern 115a. Spacers 135 have thus been formed of a material having high endurance to thermal oxidation, so as to suppress the bird's beak phenomenon.

Referring to FIG. 1G, a field oxide layer 140 is formed on the resultant structure through thermal oxidation. During this step, layer 130 becomes part of layer 140, while in the process alleviating the stress applied to the semiconductor structure. Pattern 120' does not become part of layer 140.

Further during this step, spacers 135 are consumed and become part of layer 140. However, being resistant to thermal oxidation, they are consumed more slowly than the portion of layer 130 that corresponds to the center of the inactive region of the substrate. Accordingly, the spacers retard the consumption of silicon at the ends of the inactive region, compared to the regular rate of consumption at the center. This is why the top surface of substrate 110 appears recessed in the center of the inactive region.

Referring to FIG. 1H, patterns 120' and 115a are removed from the resultant structure of FIG. 1G, to expose active regions of substrate 110 on either side of the inactive region. At this time, field oxide layer 140 is partially removed.

Thus, the isolation of the two active regions is accomplished by the inactive region between them. The inactive region is defined by the presence of the remaining portion of layer of 140.

Embodiment 2

The second embodiment is now described with reference to FIG. 2A through FIG. 2G. The process steps of FIG. 2A through FIG. 2D are the same as in the first embodiment, so their description is omitted.

Figure 2A:
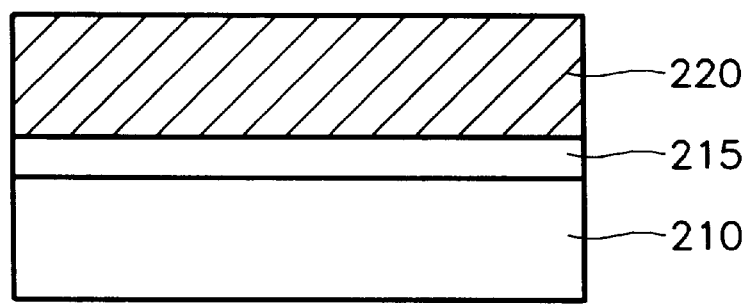
FIGS. 2A–2B, 2CA–2CC, and 2D–2G are sectional views of a semiconductor substrate illustrating process steps of an isolation method of a semiconductor device according to a second embodiment of the present invention.
Figure 2B:
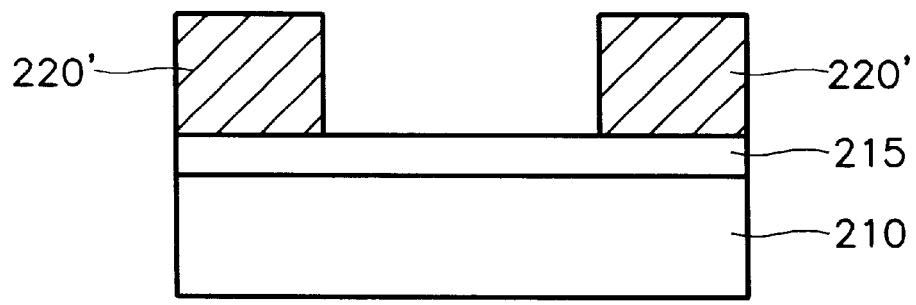
Figure 2C:
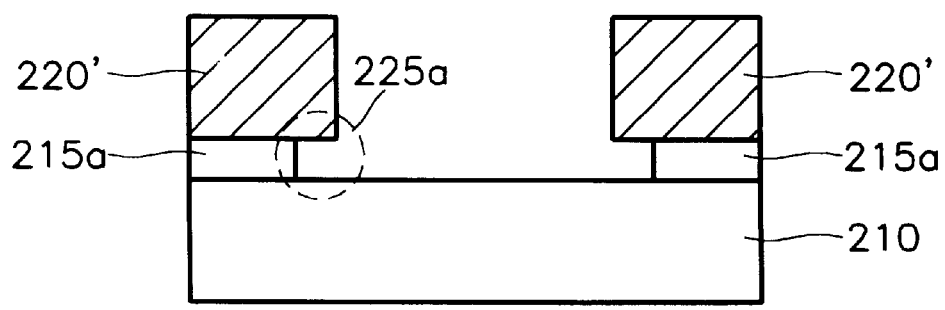
Figure 2C:
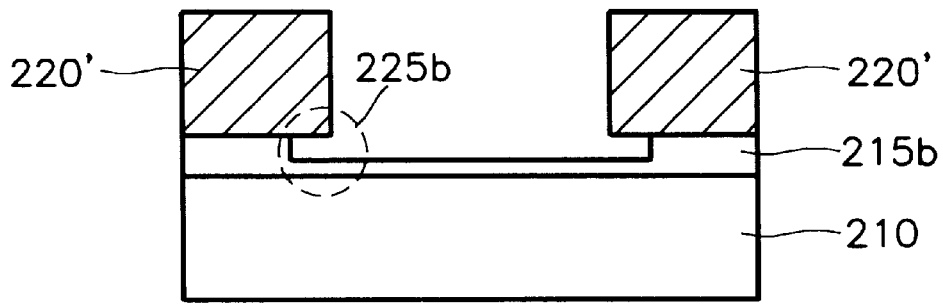
Figure 2C:
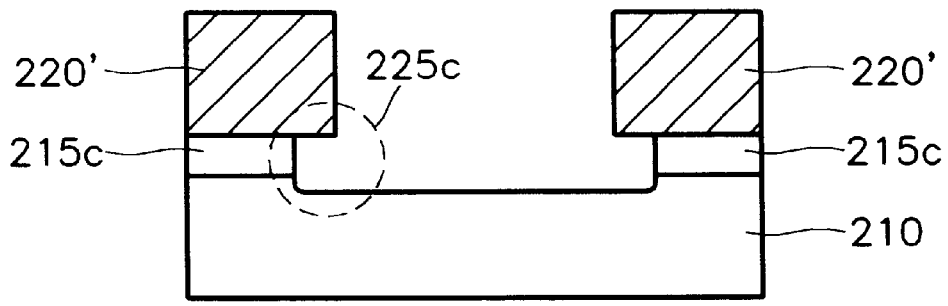
Figure 2D:
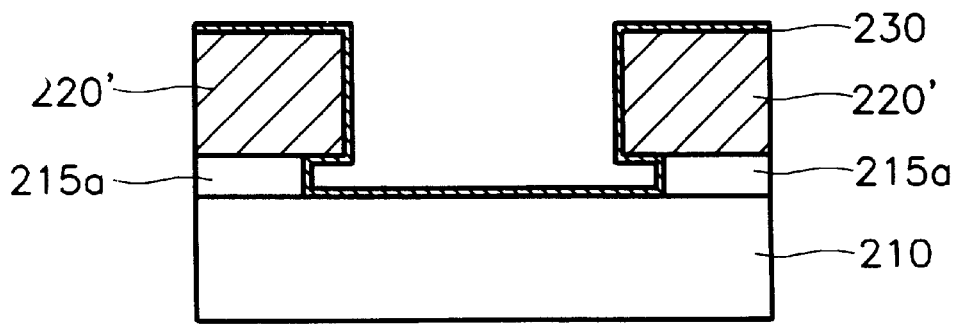
Figure 2E:
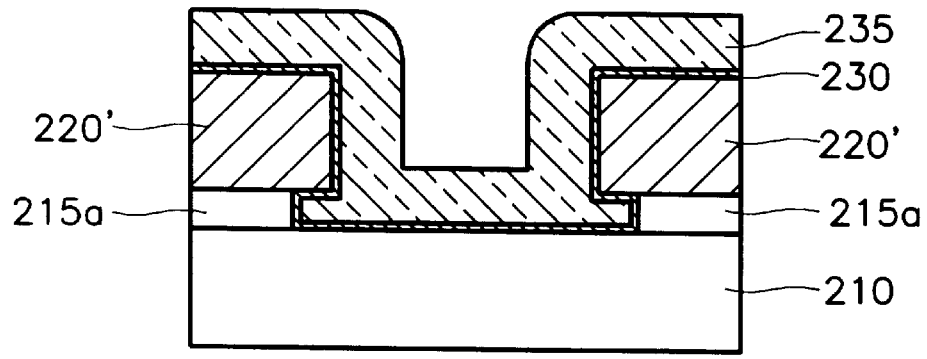

Referring to FIG. 2E, a silicon layer 235 is deposited on the entire surface of the semiconductor substrate where layer 230 is formed. Layer 235 is formed to a thickness of 300–1500 Å.

Silicon layer 235 is formed of a material having a high resistance to thermal oxidation, such as silicon nitride, polysilicon or amorphous silicon. The layer is naturally formed thicker in the corners. Optional undercuts at the corners increase the thickness further. The increased thickness at the corners will suppress the "bird's beak" phenomenon. In this second embodiment, silicon layer 235 is formed on the entire surface of second pad oxide layer 230, instead of the spacers of the first embodiment.

Figure 2F:
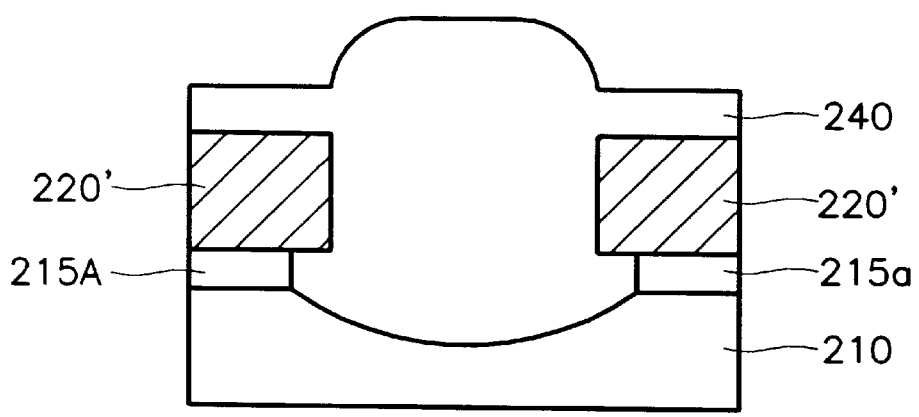

Referring to FIG. 2F, a field oxide layer 240 is formed on the entire surface of the resultant structure where silicon layer 235 is formed, through thermal oxidation. The silicon layer will be oxidized (changed to an $SiO_2$ layer), and thus become part of field oxide layer 240.

Figure 2G:
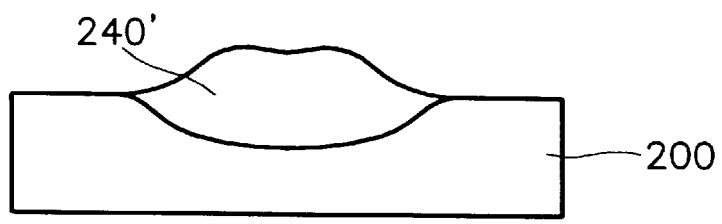

Referring to FIG. 2G, the oxide layer grown on pattern 220' is removed. Field oxide layer 240 is removed through etchback, except for a portion 240'. This step has two substeps.

In the first substep, the portion of layer 240 that is over pattern 220' is removed. For this substep, pattern 220' acts as a polishing stopper if a CMP is done, and as an etching stopper if dry or wet etching is done. Field oxide layer 240 of FIG. 2F is two or three times thicker than the portion of the oxide layer on pattern 220'. This is in order to preserve a protective thickness of the final field oxide layer 240', as the thickness of field oxide layer 240 of FIG. 2F is reduced through isotropic etching. After this substep, the device appears similar to what is shown in FIG. 1G.

The second substep is the same as in going from FIG. 1G to FIG. 1H, and which has been described above.

Electrical Characteristics

The electrical characteristics of a semiconductor device fabricated according to the isolation method of the present invention are now described.

Figure 3A:
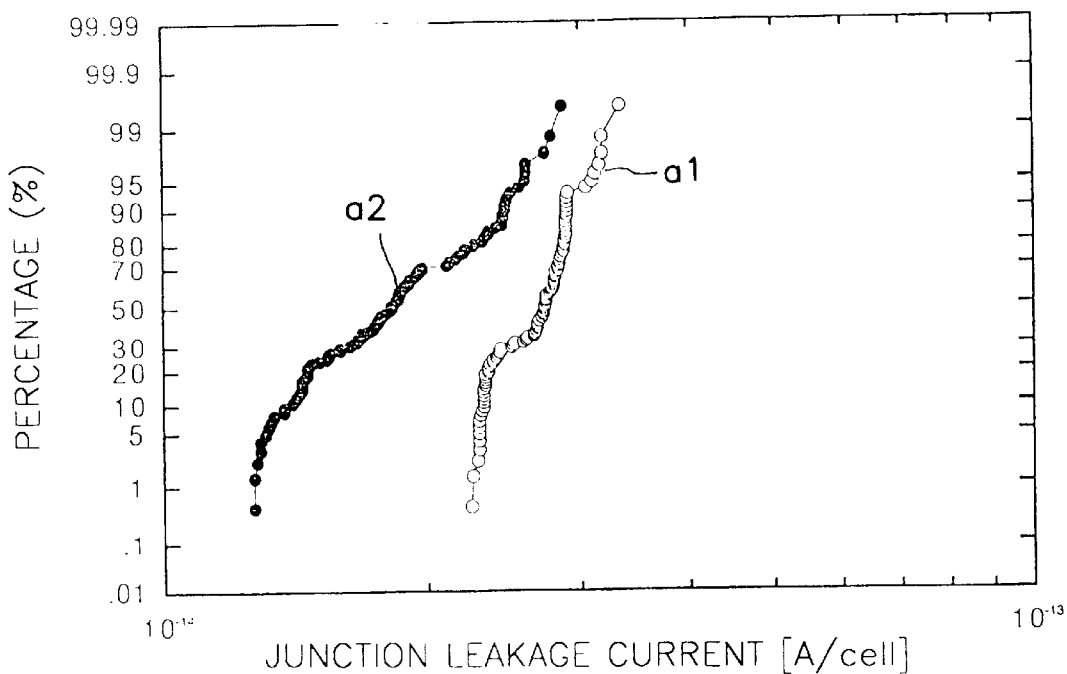
FIGS. 3A and 3B are graphs of electrical characteristics of a semiconductor device fabricated according to an isolation method of the present invention.

FIG. 3A is a graph showing junction leakage current at 83° C. and at a bias voltage of −4V, for a 32 KB DRAM cell with a second pad oxide layer of thickness 50 Å. The junction leakage current is measured for unit memory cells. Each memory cell is formed by a transistor formed in the active region and combined with a capacitor. The junction leakage current is measured for devices where the second pad oxide layer has been formed by CVD according to the present invention (data a2), and conventionally (data a1). In the vertical axis there is shown a cumulative distribution of the measured samples as a percentage. As can be seen, for any given percentage the junction leakage current of the device made according to the present invention is superior.

Figure 3B:
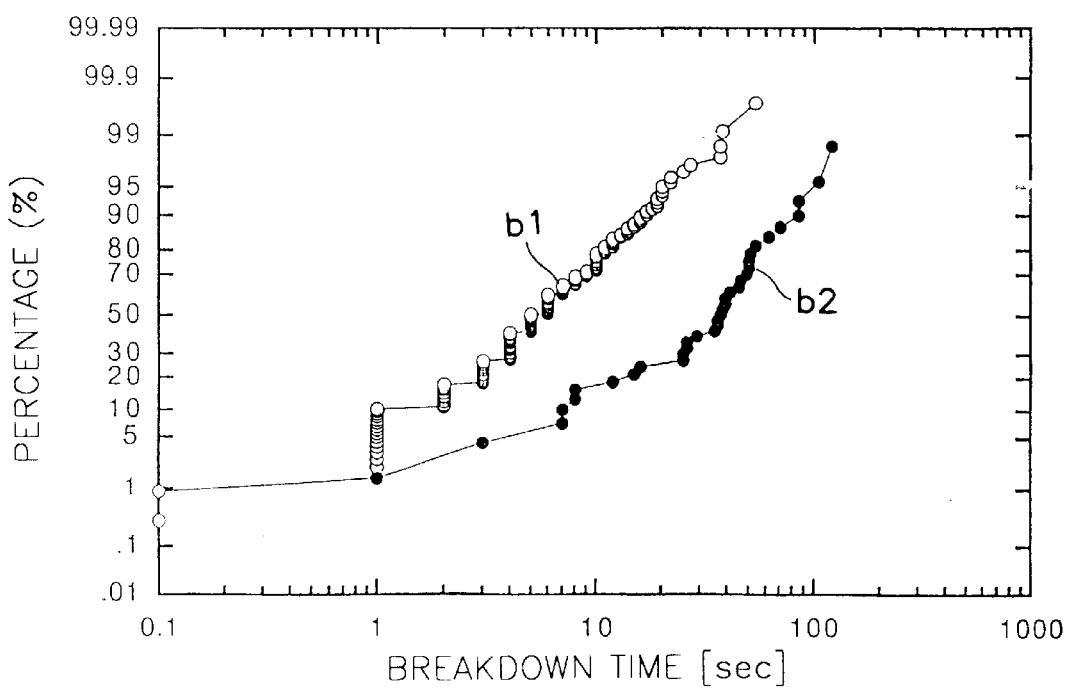

FIG. 3B is a graph showing the breakdown time of a gate oxide layer of a 128 KB DRAM cell when the second pad oxide layer is 50 Å(like in FIG. 3A). Each DRAM cell is formed in an active region and is surrounded by an inactive region (that is also called an isolation region). The breakdown time of the gate oxide layer is measured in the case where the second pad oxide layer has been formed by CVD according to the present invention (data b2), and conventionally (data b1). In the vertical axis there is shown a cumulative distribution of the measured samples as a percentage. As can be seen, for any given percentage, the breakdown time of the device made according to the present invention is superior.

Accordingly the invention results in a device with improved electrical characteristics. Also, the second pad oxide layer formed through CVD has no step coverage from the first pad oxide layer. This enhances the reliability of the gate oxide layer, which further enhances the electrical characteristics of the resulting semiconductor device.

As described above, it should be understood that the invention is not limited to the illustrated embodiment, and that many changes and modifications can be made within the scope of the invention by a person skilled in the art.

What is claimed is:

1. An isolation method in a fabrication process of a semiconductor device comprising the steps of:
   (a) sequentially forming a first pad oxide layer and a silicon nitride layer on a semiconductor substrate;
   (b) patterning the silicon nitride layer to form a silicon nitride layer pattern exposing a portion of the first pad oxide layer corresponding to an inactive region of the substrate;
   (c) etching the exposed portion of the first pad oxide layer to form a first pad oxide layer pattern, the first pad oxide layer pattern thereby having pattern sidewalls flanking the inactive region;
   (d) forming, by chemical vapor deposition, a second pad oxide layer on at least the pattern sidewalls, the second pad oxide layer thereby having final sidewalls corresponding to the pattern sidewalls;
   (e) forming spacers on at least a portion of the final sidewalls of the second pad oxide layer; and
   (f) forming a field oxide layer on the inactive region by oxidizing where the spacers are formed.

2. The method of claim 1, wherein in step (c) the first pad oxide layer is etched vertically by a preset thickness.

3. The method of claim 1 further comprising the step of forming an undercut in the first pad oxide layer pattern after step (c).

4. The method of claim 1, wherein the spacers are formed by depositing a material that is one selected from the group consisting of silicon nitride, polysilicon and amorphous silicon on the entire surface of the semiconductor substrate, and then etching the deposited material to thereby form the spacers.

5. The method of claim 1, wherein the field oxide layer of step (f) is formed through thermal oxidation.

6. The method of claim 1 further comprising the step of:
   (c-1) partially etching the exposed semiconductor substrate after step (c).

7. The method of claim 6 further comprising the step of forming an undercut in the first pad oxide layer pattern before step (c-1).

8. The method of claim 6 further comprising the step of forming an undercut in the etched semiconductor substrate and in the first pad oxide layer pattern after step (c-1).

9. The method of claim 6, wherein the spacers are formed by depositing a material that is one selected from the group consisting of silicon nitride, polysilicon and amorphous silicon on the entire surface of the semiconductor substrate, and then etching the deposited material to thereby form the spacers.

10. An isolation method in a fabrication process of a semiconductor device comprising the steps of:
    (a) sequentially forming a first pad oxide layer and a silicon nitride layer on a semiconductor substrate;
    (b) patterning the silicon nitride layer to form a silicon nitride layer pattern exposing a portion of the first pad oxide layer corresponding to an inactive region of the substrate;
    (c) etching the exposed portion of the first pad oxide layer to form a first pad oxide layer pattern, the first pad oxide layer pattern thereby having pattern sidewalls flanking the inactive region;
    (d) forming, by chemical vapor deposition, a second pad oxide layer on at least the pattern sidewalls, the second pad oxide layer thereby having final sidewalls corresponding to the pattern sidewalls and flanking the inactive region;
    (e) depositing a silicon layer on the second pad oxide layer including the final sidewalls of the second pad oxide layer; and
    (f) forming a field oxide layer on the inactive region by oxidizing where the silicon layer is formed by step (e).

11. The method of claim 10, wherein in step (c) the first pad oxide layer is etched vertically by a preset thickness.

12. The method of claim 10, wherein the combined thickness of the first pad oxide layer pattern and the second pad oxide layer is in the range of 30~300 A.

13. The method of claim 10, wherein the silicon layer of step (e) is formed to a thickness of 300~1500 A.

14. The method of claim 10, wherein the silicon layer of step (e) is formed of one selected from the group consisting of polysilicon and amorphous silicon.

15. The method of claim 10, wherein the field oxide layer of step (f) is formed through thermal oxidation.

16. An isolation method in a fabrication process of a semiconductor device comprising the steps of:
    (a) sequentially forming a first pad oxide layer and a silicon nitride layer on a semiconductor substrate;
    (b) patterning the silicon nitride layer to form a silicon nitride layer pattern exposing a portion of the first pad oxide layer corresponding to an inactive region of the substrate;
    (c) etching the exposed portion of the first pad oxide layer to form a first pad oxide layer pattern, the first pad oxide layer pattern thereby having pattern sidewalls flanking the inactive region;
    (d) partially etching the exposed semiconductor substrate;
    (e) forming, by chemical vapor deposition, a second pad oxide layer on at least the pattern sidewalls, the second pad oxide layer thereby having final sidewalls corresponding to the pattern sidewalls and flanking the inactive region; and
    (f) depositing a silicon layer on the second pad oxide layer including the final sidewalls of the second pad oxide layer; and
    (g) forming a field oxide layer on the inactive region by oxidizing where the silicon layer has been formed by step (f).

17. The method of claim 16 further comprising the step of forming an undercut in the first pad oxide layer pattern after step (c).

18. The method of claim 16 further comprising the step of forming an undercut in the etched semiconductor substrate and in the first pad oxide layer pattern after step (d).

19. The method of claim 16, wherein the silicon layer of step (f) is formed to a thickness of 300~500 A.

20. The method of claim 16, wherein the silicon layer of step (f) is formed of one selected from the group consisting of polysilicon and amorphous silicon.

21. The method of claim 16, wherein the field oxide layer of step (g) is formed through thermal oxidation.

* * * * *